US012217785B2

(12) United States Patent
Chuang et al.

(10) Patent No.: US 12,217,785 B2
(45) Date of Patent: Feb. 4, 2025

(54) METHOD OF AND APPARATUS FOR REFRESHING MEMORY DEVICES

(71) Applicant: TAIWAN SEMICONDUCTOR MANUFACTURING COMPANY, LTD., Hsinchu (TW)

(72) Inventors: Ming-Yen Chuang, Hsinchu (TW); Katherine H. Chiang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 180 days.

(21) Appl. No.: 18/160,564

(22) Filed: Jan. 27, 2023

(65) Prior Publication Data

US 2024/0105249 A1 Mar. 28, 2024

Related U.S. Application Data

(60) Provisional application No. 63/376,883, filed on Sep. 23, 2022.

(51) Int. Cl.
*G11C 11/406* (2006.01)
*G11C 11/4091* (2006.01)
*G11C 11/4096* (2006.01)

(52) U.S. Cl.
CPC .... *G11C 11/40615* (2013.01); *G11C 11/4091* (2013.01); *G11C 11/4096* (2013.01)

(58) Field of Classification Search
CPC .......... G11C 11/40615; G11C 11/4091; G11C 11/4096; G11C 2029/0411; G11C 7/1006; G11C 11/419
USPC ....................................................... 365/222
See application file for complete search history.

(56) References Cited

U.S. PATENT DOCUMENTS

2018/0240509 A1* 8/2018 Zawodny .............. G11C 11/408

FOREIGN PATENT DOCUMENTS

CN 113936728 A * 1/2022

OTHER PUBLICATIONS

Kong et al. (Year: 2022).*

* cited by examiner

*Primary Examiner* — Fernando Hidalgo
(74) *Attorney, Agent, or Firm* — Hauptman Ham, LLP

(57) ABSTRACT

An integrated circuit includes an array of word lines, and an array of memory cells configured to receive selection signals from the array of word lines. Each memory cell in the array of memory cells is connected to one or more data lines in a set of data lines. The integrated circuit also includes a read-write driver which is connected to the set of data lines and is configured to receive a flip-refresh control signal. The read-write driver has a catch circuit configured to store a first bit value related to a stored bit value in a selected memory cell. The read-write driver is configured to store into the selected memory cell a second bit value which is a bit inversion of the stored bit value.

20 Claims, 14 Drawing Sheets

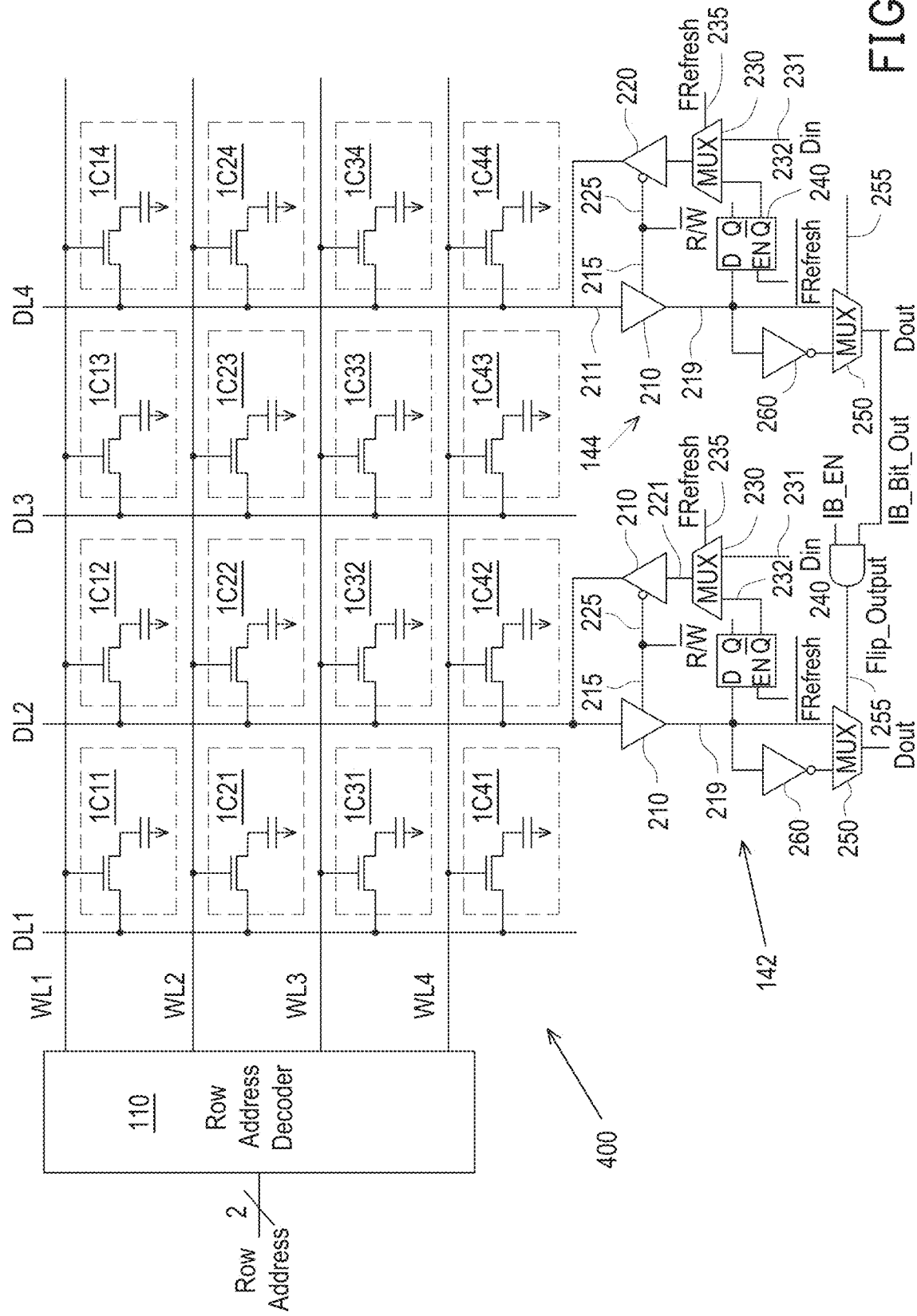

US 12,217,785 B2

1

METHOD OF AND APPARATUS FOR REFRESHING MEMORY DEVICES

PRIORITY CLAIM

The present application claims the benefit of U.S. Provisional Application No. 63/376,883, filed Sep. 23, 2022, which is incorporated herein by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize, and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a circuit diagram of a memory circuit having a read-write driver that is configured to perform bit inversions based on an indicator bit, in accordance with some embodiments.

DETAILED DESCRIPTION

Figure 1A:
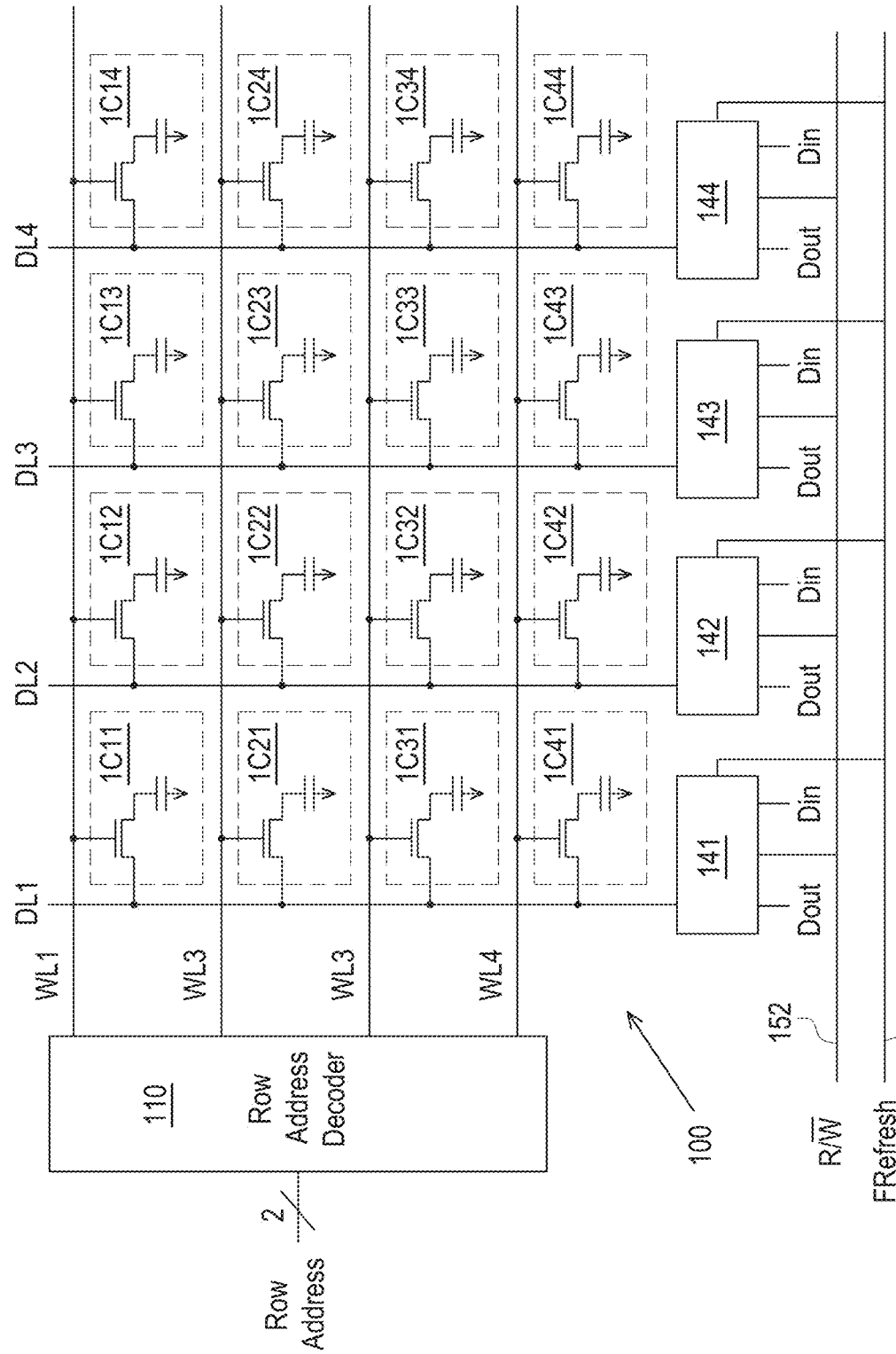
FIGS. 1A-1B are circuit diagrams of a memory circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a data word and an indicator bit are stored in an array of bit cells of a memory device. Specifically, each bit value in the data word is stored into a data bit cell as a stored data bit value and an indicator bit value of the indicator bit is stored into an indicator bit cell as stored a stored indicator bit value. The array of bit cells is repetitively refreshed with bit inversion. When the array of bit cells is refreshed, the stored data bit value in each data bit cell is read as a read-out data bit value, and a bit inversion of the read-out data bit value is stored into the data bit cell again as a new stored data bit value. In addition, the stored indicator bit value from the indicator bit cell is read as a read-out indicator bit value, and a bit inversion of the read-out indicator bit value is stored into the indicator bit cell again as a new stored indicator bit value.

In some embodiments, when the indicator bit is stored with the data bits in the data word, if the indicator bit and the data bits are refreshed together with bit inversion, the original bit value of each data bit can be recovered based on the stored bit value of the corresponding data bit and the stored bit value of the indicator bit.

In some embodiments, when the array of bit cells is refreshed with bit inversion, the stress induced in each bit cell in the array of bit cells is reduced, as compared with alternative implementations in which the array of bit cells is not refreshed or only refreshed without bit inversion. The stress is induced because of the constant inversion of the stored bit value in a bit cell. For some bit cells, if a stored bit value in a bit cell is maintained in one constant value for long time, the electric properties (e.g., a threshold of a transistor in the bit cell) may change, which may cause the reduction of reliability and/or cause the increase of retention errors.

Figure 1B:
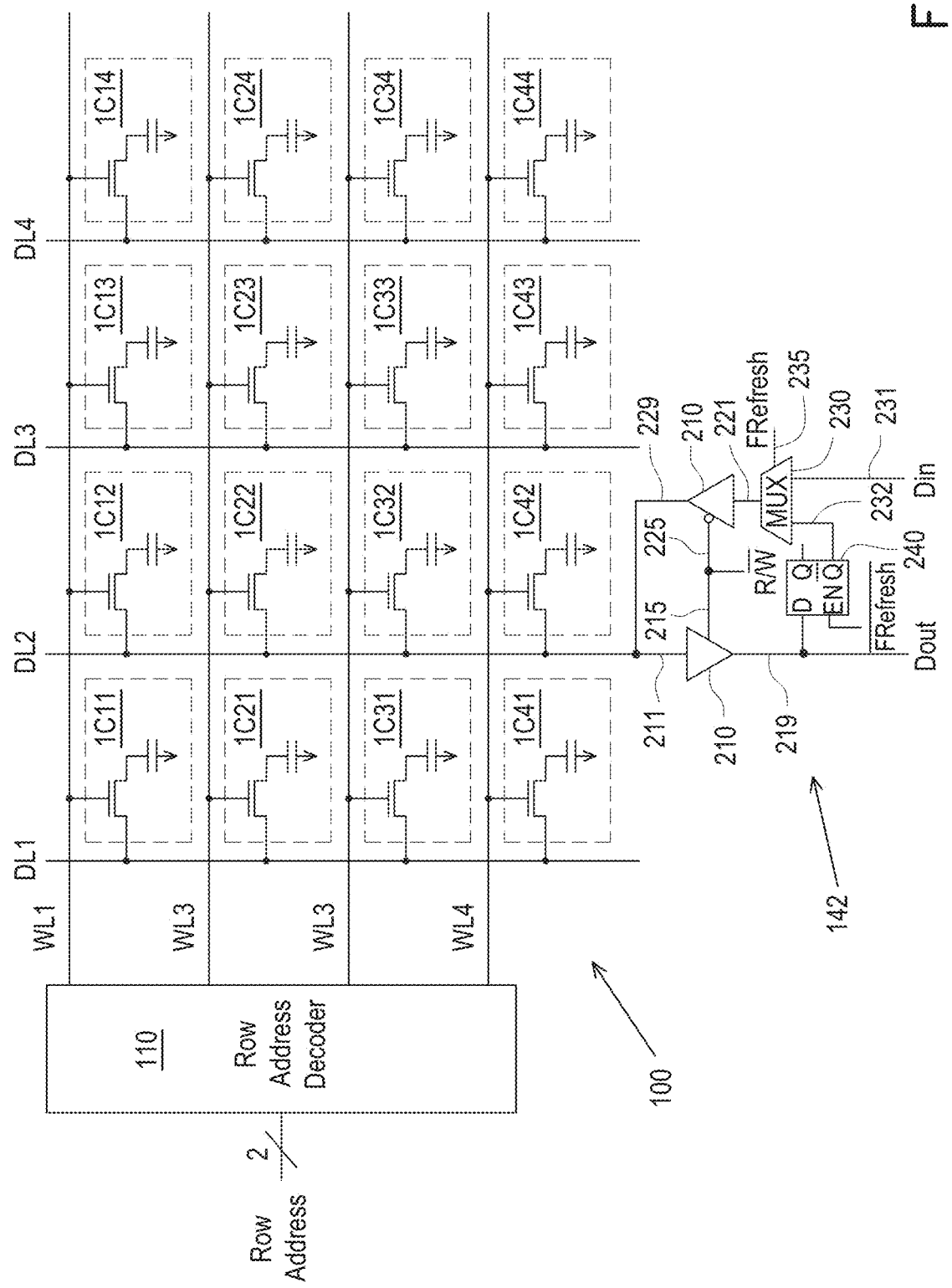

FIGS. 1A-1B are circuit diagrams of a memory circuit 100, in accordance with some embodiments. The memory circuit 100 includes memory cells (e.g., 1C11, 1C22, ..., and 1C44) arranged in a matrix that has M rows and N columns. While the memory cells in FIGS. 1A-1B are arranged in a 4×4 matrix, the number of rows M=4 and N=4 are selected as an example. A number of rows other than M=4 is within the contemplated scope of the present disclosure. A number of columns other than N=4 is also within the contemplated scope of the present disclosure. Furthermore, if the number of columns in the memory circuit 100 is greater than 4 (i.e., N>4), the memory circuit 100 includes additional columns of memory cells that are not explicitly shown in the figure.

The memory cells in FIGS. 1A-1B are arranged in four rows of memory cells. The first row of memory cells includes memory cells 1C11-1C14, the second row of memory cells includes memory cells 1C21-1C24, the third row of memory cells includes memory cells 1C31-1C34, and the fourth row of memory cells includes memory cells 1C41-1C44. The memory circuit 100 has an array of word lines including word lines WL1, WL2, WL3, and WL4. Each of the memory cells 1C11-1C14 in the first row is connected to the word line WL1. Each of the memory cells 1C21-1C24 in the second row is connected to the word line WL2. Each of the memory cells 1C31-1C34 in the third row is connected to the word line WL3. Each of the memory cells 1C41-1C44 in the fourth row is connected to the word line WL4. In FIGS. 1A-1B, each of the memory cells is a dynamic random access memory cell which has one transistor and one storage capacitor.

The memory circuit 100 also has an array of data lines including data lines DL1, DL2, DL3, and DL4. Each of the memory cells 1C11-1C41 in the first column is connected to the data line DL1. Each of the memory cells 1C12-1C42 in the second column is connected to the data line DL2. Each of the memory cells 1C13-1C43 in the third column is connected to the data line DL3. Each of the memory cells 1C14-1C44 in the fourth column is connected to the data line DL4. Each of the data lines DL1, DL2, DL3, and DL4 is correspondingly driven by one of the read-write drivers 141, 142, 143, and 144. Each of the read-write drivers has a data-input terminal Din and a data-output terminal Dout. The data lines DL1, DL2, DL3, and DL4 receive an input bit value correspondingly from the data-input terminal Din in one of the read-write drivers 141, 142, 143, and 144, when the read-write drivers are in the write mode. An output bit value in each of the data lines DL1, DL2, DL3, and DL4 is transmitted correspondingly to the data-output terminal Dout in one of the read-write drivers 141, 142, 143, and 144, when the read-write drivers are in the read mode.

Each of the read-write drivers also has a read-write control terminal connected to a read-write control line 152 and a flip-refresh control terminal connected to a flip-refresh line 155. When the control signal R/$\overline{\text{W}}$ on the read-write control line 152 is set to a first logic level (such as, logic HIGH), each of the read-write drivers 141, 142, 143, and 144 is set to the read mode. When the read-write control line 152 is set to a second logic level (such as, logic LOW), each of the read-write drivers 141, 142, 143, and 144 is set to the write mode. The logic levels of the flip-refresh control signal FRefresh on the flip-refresh line 155 control the flip refresh processes of the memory cells in the memory circuit 100. In some embodiments, when a memory cell is selected and subjected to a flip refresh process, the stored bit value in the selected memory cell is read out as a read-out bit value, and the bit inversion of the read-out bit value is written back to the selected memory cell. An example implementation of the read-write driver that is operable to perform the flip refresh operation is shown in FIG. 1B.

In FIGS. 1A-1B, the memory circuit 100 includes a row address decoder 110 which is coupled to the word lines WL1, WL2, WL3, and WL4. In operation, when a row address code is received and decoded by the row address decoder 110, a selected word line (as specified by the row address code) is selected. In the example of FIG. 1A, the row address code received by the row address decoder 110 is a two-bits code to specify one of the four word lines. When a selected word line is selected by the row address decoder 110, a word line selection signal is generated on the selected word line and a word line deselection signal is generated on each of the non-selected word lines. In FIGS. 1A-1B, when a selected word line is selected, each of the memory cells that are connected to the selected word line are selected for a read operation, a write operation, or a flip refresh operation.

As an example, if the word line WL2 is selected, a word line selection signal is generated on the word line WL2 and a word line deselection signal is generated on each of the non-selected word lines WL1, WL3, and WL4. The word line selection signal on the word line WL2 turns on the transistor in each of the memory cells 1C21-1C24 in the second row, while the word line deselection signals on the non-selected word lines WL1, WL3, and WL4 turn off the transistor in each of the memory cells in all other rows (with the second row as the exception). When the transistor in each of the memory cells 1C21-1C24 in the second row is turned on, the storage capacitor in each of the memory cells 1C21, 1C22, 1C23, and 1C24 is correspondingly connected to one of the data lines DL1, DL2, DL3, and DL4, and each of the memory cells 1C21-1C24 is ready for a read operation, a write operation, or a flip refresh operation by a read-write driver. Specifically, after the storage capacitors are connected to the data lines, the stored bit value in each of the selected memory cells 1C21-1C24 is read by the corresponding read-write driver through one of the data lines DL1-DL4 as an output bit value at the corresponding data-output terminal Dout, if the corresponding read-write driver is in the read mode. Alternatively, an input bit value at the data-output terminal Din is written into each of the selected memory cells 1C21-1C24 as the stored bit value by the corresponding read-write driver through one of the data lines DL1-DL4 when the corresponding read-write driver is in the write mode. In the memory circuit 100, the stored bit value in a memory cell is represented by the voltage across the storage capacitor in the memory cell.

Like the read operation and the write operation, the flip refresh operation on each of the selected memory cells 1C21-1C24 is also performed by the corresponding read-write driver through one of the data lines DL1-DL4 when the corresponding read-write driver is in the flip refresh operation mode, but the flip refresh operation is explained in more details later with respect to FIG. 1B and FIG. 2C.

In some embodiments, each of the word lines WL1, WL2, WL3, and WL4 is selected in sequence as the selected word line. In some embodiments, when each of the read-write drivers 141, 142, 143, and 144 is set to the read mode by the control signal R/$\overline{\text{W}}$ on the read-write control line 152, as each of the word lines WL1, WL2, WL3, and WL4 becomes the selected word line in sequence, the stored bit values in the memory cells in the memory circuit 100 are read out by the read-write drivers row by row. Specifically, as each of the word lines becomes the selected word line, the read operation on the memory cells 1C11-1C14 in the first row is followed by the read operation on the memory cells 1C21-1C24 in the second row, then followed by the read operation on the memory cells 1C31-1C34 in the third row, and further followed by the read operation on the memory cells 1C41-1C44 in the fourth row.

In some embodiments, when each of the read-write drivers 141, 142, 143, and 144 is set to the write mode by the control signal R/$\overline{\text{W}}$ on the read-write control line 152, as each of the word lines WL1, WL2, WL3, and WL4 becomes the selected word line in sequence, input bit values are written into the selected memory cells by the read-write drivers row by row. Specifically, as each of the word lines becomes the selected word line, the write operation on the memory cells 1C11-1C14 in the first row is followed by the write operation on the memory cells 1C21-1C24 in the second row, then followed by the write operation on the memory cells 1C31-1C34 in the third row, and further followed by the write operation on the memory cells 1C41-1C44 in the fourth row.

In some embodiments, when the memory circuit 100 is set to the flip refresh mode by the flip-refresh control signal FRefresh on the flip-refresh line 155, the stored bit value in each of the selected memory cells in a row (which are all connected to a selected word line) is refreshed with a flipped bit value. In the process of flip-refreshing the stored bit value in a selected memory cell, the stored data bit value is read from the selected memory cell as a read-out bit value by a corresponding read-write driver, then, a bit inversion of the read-out bit value is written back into the selected memory cell by the corresponding read-write driver as the stored bit value (which has now been updated).

In some embodiments, while the memory circuit 100 is set to the flip refresh mode, as each of the word lines WL1, WL2, WL3, and WL4 becomes the selected word line in sequence, the selected memory cells in the selected row are flip-refreshed by the read-write drivers row by row. Specifically, as each of the word lines becomes the selected word line, the flip-refreshing operation on the memory cells 1C11-1C14 in the first row is followed by the flip-refreshing operation on the memory cells 1C21-1C24 in the second row, then followed by the flip-refreshing operation on the memory cells 1C31-1C34 in the third row, and further followed by the flip-refreshing operation on the memory cells 1C41-1C44 in the fourth row.

In the memory circuit 100, each of the read-write drivers 141, 142, 143, and 144 is implemented with the function to provide flip-refreshing operation on a memory cell. An example implementation of the read-write driver is shown in FIG. 1B.

FIG. 1B is a circuit diagram of a memory circuit 100 having a read-write driver operable for flip-refreshing operation, in accordance with some embodiments. In FIG. 1B, the read-write driver 142 includes a sense amplifier 210, a catch circuit such as a D-latch 240, a write multiplexer 230, and a write driver 220. The input of the sense amplifier 210 and the output of the write driver 220 are both connected to the data line DL2. The read-write driver 142 is used to perform the read operation, the write operation, and the flip-refreshing operation on the column of memory cells 1C12-1C42 connected to the data line DL2. The catch circuit is configured to store a cached bit value related to a bit value at the output of the sense amplifier 210.

The output 219 of the sense amplifier 210 is connected to an input D of the D-latch 240. The output of the sense amplifier 210 is also implemented as the data-output terminal Dout of the read-write driver 142. The complement output Q of the D-latch 240 is connected to an input 232 of the write multiplexer 230. The data-input terminal Din of the read-write driver 142 is connected to an input 231 of the write multiplexer 230. The output of the write multiplexer 230 is connected to the input 221 of the write driver 220.

The state of the write multiplexer 230 and the state of the D-latch 240 are controlled by the flip-refresh control signal FRefresh. The write multiplexer 230 has a control terminal 235 configured to receive the flip-refresh control signal FRefresh, and the D-latch 240 has an enable terminal EN configured to receive an inversion of the flip-refresh control signal FRefresh. The sense amplifier 210 has a control terminal 215 configured to receive the control signal RAN, and the sense amplifier 210 is enabled when the control signal R/$\overline{W}$ is at logic HIGH. The write driver 220 has a control terminal 225 configured to receive the control signal RAN, and the write driver 220 is enabled when the control signal R/$\overline{W}$ is at logic LOW.

Figure 2A:
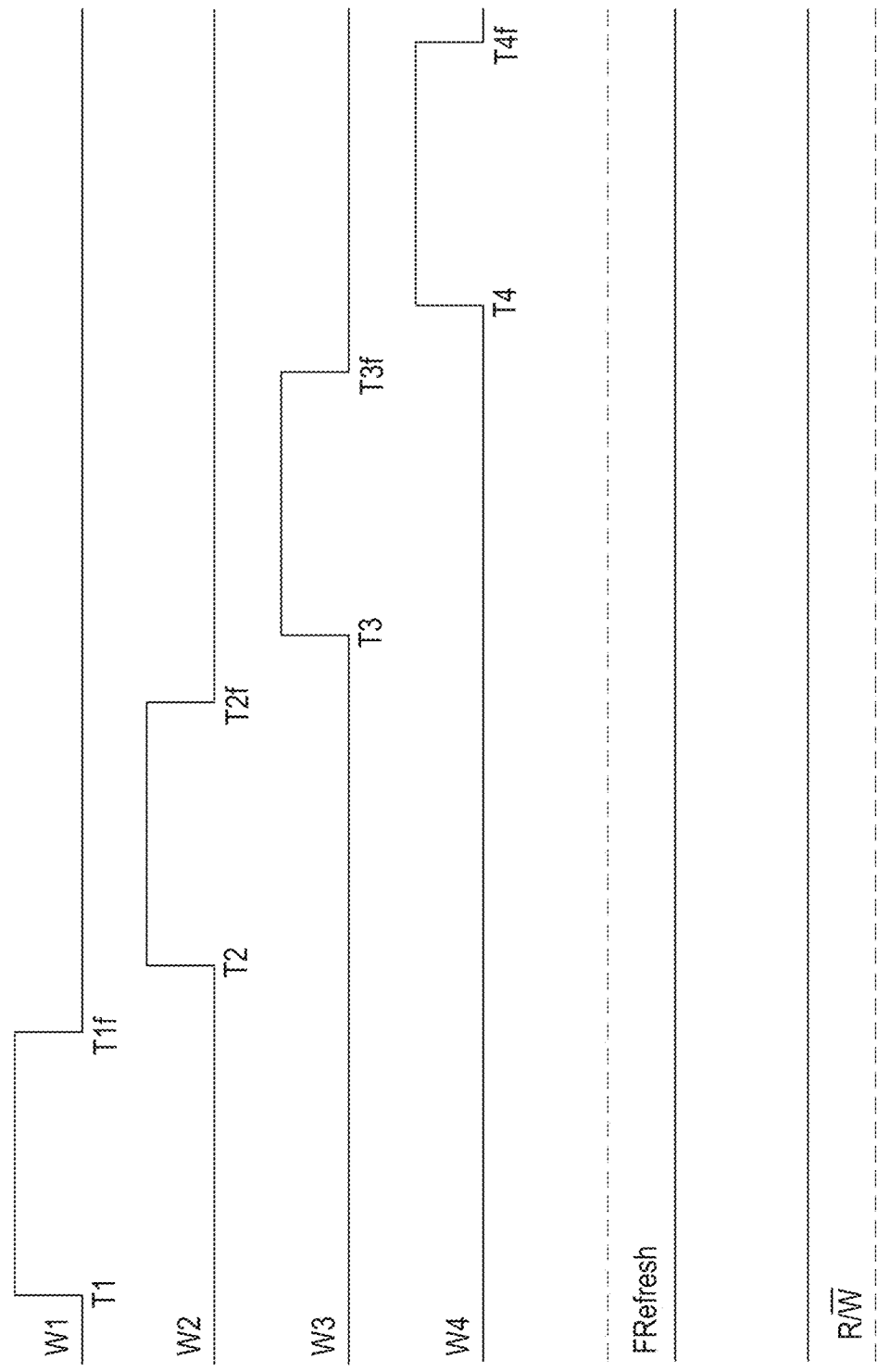
FIGS. 2A-2C are timing diagrams of various control signals applied to the memory circuit 100, in accordance with some embodiments.
Figure 2B:
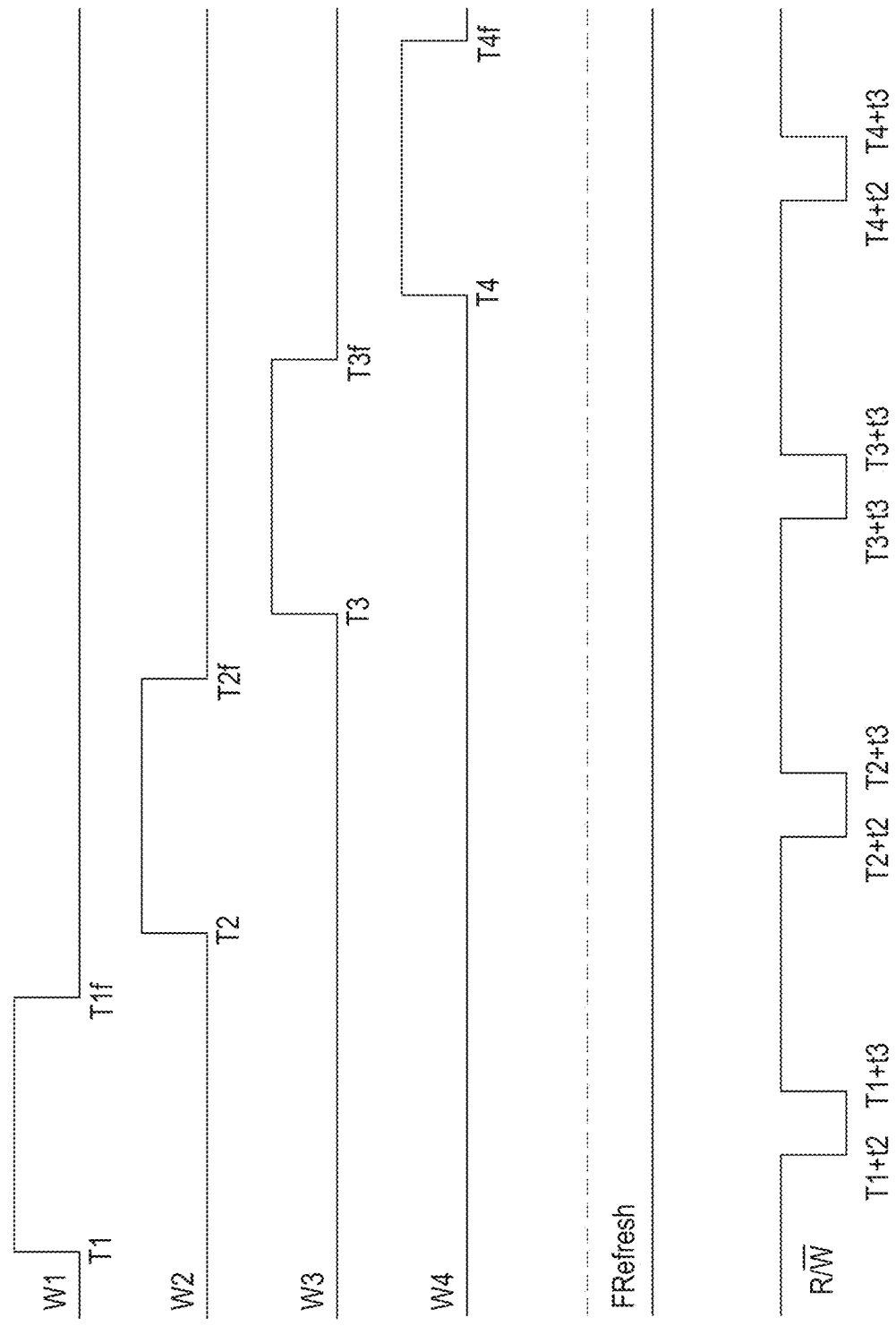
Figure 2C:
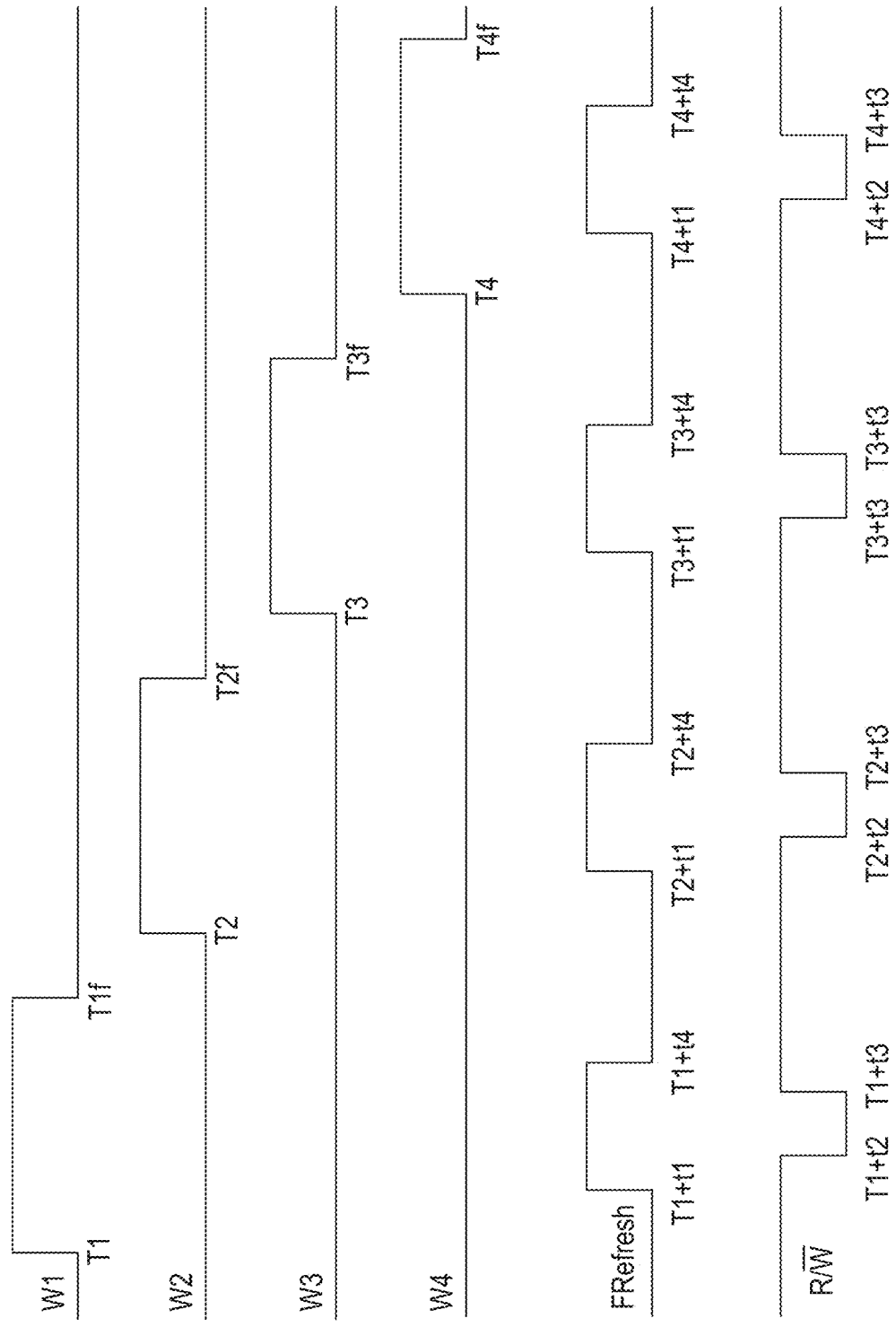

FIGS. 2A-2C are timing diagrams of various control signals applied to the memory circuit 100, in accordance with some embodiments. In FIGS. 2A-2C, each of the word lines WL1, WL2, WL3, and WL4 becomes the selected word line in sequence. The word line WL1 is selected as the selected word line, when the word line selection signal on the word line WL1 is at logic HIGH between time T1 and time T1$f$. Subsequently, the word line WL2 is selected as the selected word line between time T2 and time T2$f$, the word line WL3 is selected as the selected word line between time T3 and time T3$f$, and the word line WL4 is selected as the selected word line between time T4 and time T4$f$.

In FIGS. 2A-2B, the flip-refresh control signal FRefresh remains at logic LOW, and the flip refreshing mode of the read-write driver 142 is disabled. In FIG. 2A, the read-write driver 142 is set to the reading mode when the control signal R/$\overline{W}$ is at logic HIGH, and the read-write driver 142 is set to the writing mode when the control signal R/$\overline{W}$ is at logic LOW. In FIG. 2C, and the read-write driver 142 is set to the flip refreshing mode during the time period when the flip-refresh control signal FRefresh is at logic HIGH.

When the read-write driver 142 is in the reading mode or the writing mode, the flip-refresh control signal FRefresh is at logic LOW, the logic level at the complement output Q of the D-latch 240 has no influence to the logic level at the input of the write driver 220, while the logic level at the data-input terminal Din of the read-write driver 142 is transmitted to the input of the write driver 220.

During the writing mode, because the control signal R/$\overline{W}$ is at logic LOW, the write driver 220 is enabled and the sense amplifier 210 is disabled. Consequently, the logical signal at the data-input terminal Din of the read-write driver 142 is transmitted to the data line DL2, while the data-output terminal Dout of the read-write driver 142 is prevented from receiving logical signals from the data line DL2.

During the reading mode, because the control signal R/$\overline{W}$ is at logic HIGH, the write driver 220 is disabled and the sense amplifier 210 is enabled. Consequently, the logical signal from the data line DL2 is transmitted to data-output terminal Dout of the read-write driver 142 while the data line DL2 is not influenced by logical signals at the data-input terminal Din.

In FIG. 2A, the control signal R/$\overline{W}$ remains at logic HIGH, and the read-write driver 142 are maintained in the reading mode. The memory cell 1C12 is read by the read-write driver 142 when the word line WL1 is selected between time T1 and time T1$f$. The memory cell 1C22 is read by the read-write driver 142 when the word line WL3 is selected between time T2 and time T2$f$. The memory cell 1C32 is read by the read-write driver 142 when the word line WL3 is selected between time T3 and time T3$f$. The memory cell 1C42 is read by the read-write driver 142 when the word line WL1 is selected between time T4 and time T4$f$.

In FIG. 2B, the read-write driver 142 changes from the reading mode to the writing mode, when the control signal R/$\overline{W}$ changes from logic HIGH to logic LOW. When the memory cell 1C12 is selected between time T1 and time T1$f$ by the word line WL1, the bit signal at the data-input terminal Din of the read-write driver 142 is written into the memory cell 1C12 as the stored bit value during the time period between time T1+t2 and T1+t3. When the memory cell 1C22 is selected between time T2 and time T2*f* by the word line WL2, the bit signal at the data-input terminal Din of the read-write driver 242 is written into the memory cell 1C22 as the stored bit value during the time period between time T2+t2 and T2+t3. When the memory cell 1C32 is selected between time T3 and time T3*f* by the word line WL3, the bit signal at the data-input terminal Din of the read-write driver 342 is written into the memory cell 1C32 as the stored bit value during the time period between time T3+t2 and T3+t3. When the memory cell 1C42 is selected between time T4 and time T4*f* by the word line WL4, the bit signal at the data-input terminal Din of the read-write driver 442 is written into the memory cell 1C42 as the stored bit value during the time period between time T4+t2 and T4+t3.

In FIG. 2C, the read-write driver 142 is set to the flip refreshing mode during the time period when the flip-refresh control signal FRefresh is at logic HIGH. When the memory cell 1C12 is selected between time T1 and time T1*f* by the word line WL1, the stored bit value of the memory cell 1C22 is flip refreshed during the time period between time T1+t1 and T1+t4. When the memory cell 1C22 is selected between time T2 and time T2*f* by the word line WL2, the stored bit value of the memory cell 1C32 is flip refreshed during the time period between time T2+t1 and T2+t4. When the memory cell 1C32 is selected between time T3 and time T3*f* by the word line WL3, the stored bit value of the memory cell 1C32 is flip refreshed during the time period between time T3+t1 and T3+t4. When the memory cell 1C42 is selected between time T4 and time T4*f* by the word line WL4, the stored bit value of the memory cell 1C42 is flip refreshed during the time period between time T4+t1 and T4+t4.

During the process that the stored bit value of a memory cell is flip refreshed, the stored data bit value is read from the memory cell as a read-out bit value, and a bit inversion of the read-out bit value is written back into the selected memory cell. In the following, as an example, the flip refresh operation on the memory cell 1C22 is described in more details.

As shown in FIG. 2C, the memory cell 1C22 is selected during the time period between time T2 and time T2*f*, and the memory cell 1C22 is subject to the flip refresh operation between time T2+t1 and time T2+t4.

During the time period between time T2 and time T2+t1, the memory cell 1C22 is in the read mode between time T2 and time T2+t1, because the flip-refresh control signal FRefresh is at logic LOW and the control signal R/$\overline{W}$ is at logic HIGH. The stored bit value of the memory cell 1C22 is read out as a read-out bit value at the output 219 of the sense amplifier 210, and the read-out bit value at the output 219 is coupled to the input D of the D-latch 240. The logic value at the complement output Q of the D-latch 240 changes with the read-out bit value at the output 219 of the sense amplifier 210, because the complement of the flip-refresh control signal FRefresh is at logic HIGH which is coupled to the enable input of the D-latch 240. The complement output Q of the D-latch 240, however, is decoupled from the input 221 of the write driver 220 by the write multiplexer 230, because the flip-refresh control signal FRefresh is at logic LOW which is coupled to the control terminal 235 of the write multiplexer 230.

At time T2+t1, the flip-refresh control signal FRefresh is changed from logic LOW to logic HIGH, and the memory cell 1C22 is changed to the flip refresh mode. At time T2+t1, the control signal R/$\overline{W}$ is still at logic HIGH, and the stored bit value of the memory cell 1C22 is still read out as a read-out bit value at the output 219 of the sense amplifier 210. When the complement of the flip-refresh control signal FRefresh (which is coupled to the enable input of the D-latch 240) is changed to logic LOW, the read-out bit value at the output 219 of the sense amplifier 210 is cached by the D-latch 240. The logic value at the complement output Q of the D-latch 240 is maintained at a logic value which is the bit inversion of the read-out bit value at the output 219 at time T2+t1. The maintained logic value at the complement output Q of the D-latch 240 is unchanged from time T2+t1 to time T2+t4 when the flip-refresh control signal FRefresh is maintained at logic HIGH. Furthermore, between time T2+t1 to time T2+t4, the maintained logic value at the complement output Q of the D-latch 240 is transmitted to the input 221 of the write driver 220 through the write multiplexer 230 while the data-input terminal Din is decoupled from the input 221 of the write driver 220 by the write multiplexer 230. That is, during the time period between time T2+t1 to time T2+t4, the bit inversion of the read-out bit value at the output 219 is transmitted to the input 221 of the write driver 220. In other words, the bit inversion of the stored bit value of the memory cell 1C22 cached at time T2+t1 is transmitted to the input 221 of the write driver 220.

At time T2+t2, when the control signal R/$\overline{W}$ is changed from logic HIGH to logic LOW, the write driver 220 is enabled and the sense amplifier 210 disabled. During the time period between time T2+t2 and time T2+t3, the maintained logic value at the complement output Q of the D-latch 240 is transmitted to the data line DL2. The stored bit value of the memory cell 1C22 at time T2+t3 is a bit inversion of the stored bit value of the memory cell 1C22 cached at time T2+t1. That is, the stored bit value of the memory cell 1C22 has been flipped.

Then, at time T2+t4, as the flip-refresh control signal FRefresh is changed from logic HIGH to logic LOW, the read-write driver 142 returns to the read mode, and the stored bit value of the memory cell 1C22 remains the same. Thereafter, at time T2*f*, as the word line selection signal on the word line WL2 is changed from logic HIGH to logic LOW, the transistor in the memory cell 1C22 is turned off and the storage capacitor in the memory cell 1C22 is decoupled from the data line DL2. After time T2*f*, the memory cell 1C22 is deselected, as the word line selection signal on the word line WL2 remains at logic LOW.

In FIG. 2C, after the memory cell 1C12 is selected between time T2 and time T2*f* by the word line WL2 for flip refresh operation, the memory cell 1C32 is selected between time T3 and time T3*f* by the word line WL3 for flip refresh operation, and then the memory cell 1C42 is selected between time T4 and time T4*f* by the word line WL4 for flip refresh operation. In some embodiments, after the memory cell in the last row (e.g., the memory cell 1C42) is selected for flip refresh operation, then the memory cell in the first row (e.g., the memory cell 1C12) is again selected for another flip refresh operation, followed by the selection of the memory cell in the second row (e.g., the memory cell 1C22).

The selection process for flip refresh operation continues row by row. After the last row is selected, the process repeats starting form the first row. As the selection process continues and repeats, the memory cell in a given row (at a particular column of interests) is repetitively selected for flip refresh operation. In some embodiments, the time interval between two consecutive selections of the memory cell in the given row is a constant delay, and consequently the memory cell in the given row is periodically selected for flip refresh operation. In some alternative embodiments, the time interval between two consecutive selections of the memory cell in the given row is not a constant delay.

In some embodiments, the data to be stored in a memory device is a word having multiple bits. In some embodiments, the multiple-bit word is augmented with an indicator bit, and the multiple-bit word is stored in the memory device along with the indicator bit. In some embodiments, the multiple bits in the multiple-bit word and the indicator bit are all stored in memory cells of a same row.

Figure 3:
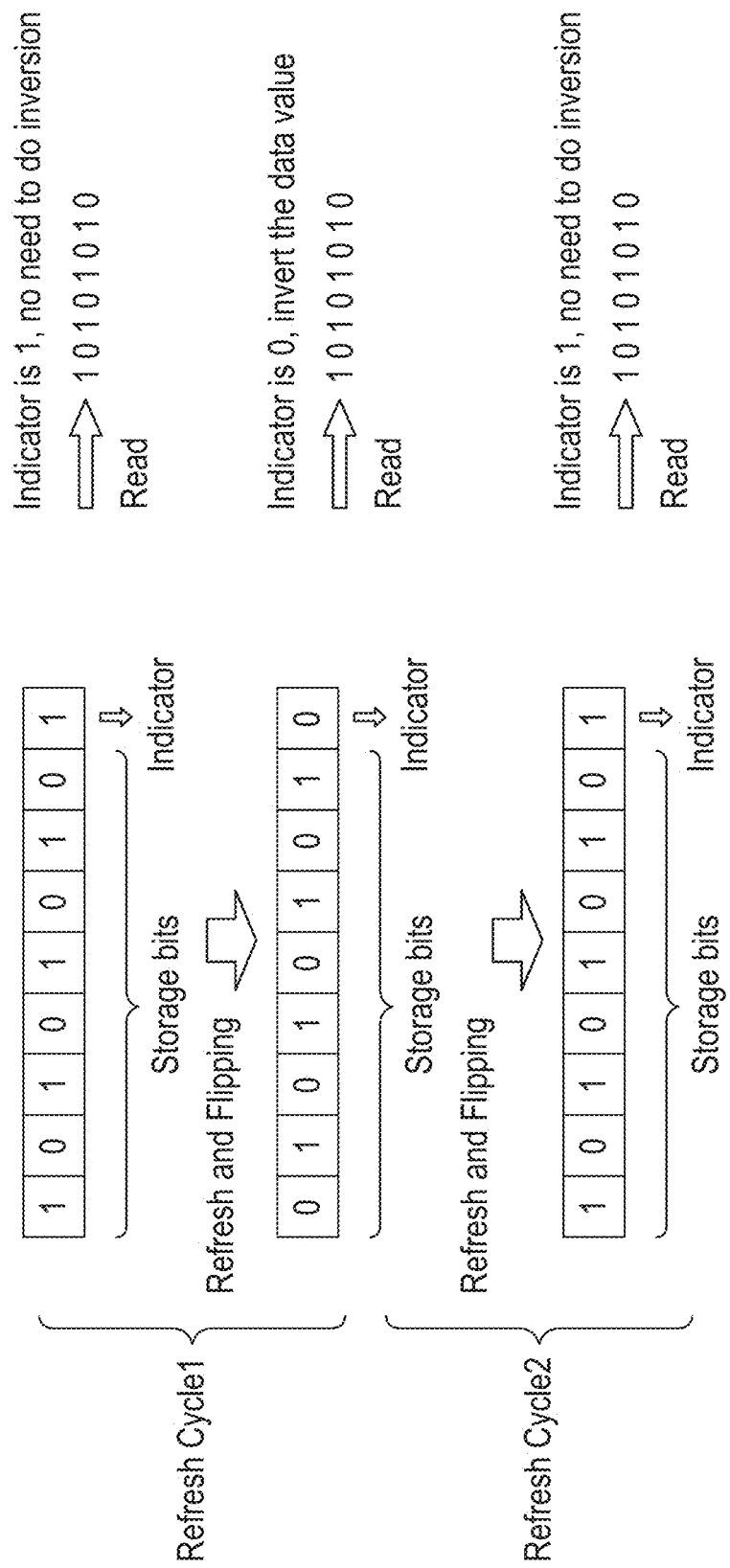
FIG. 3 is a schematic diagram of the stored bit values of a multiple-bit word and an indicator bit at various refresh cycles, in accordance with some embodiments.

FIG. 3 is a schematic diagram of the stored bit values of a multiple-bit word and an indicator bit at various refresh cycles, in accordance with some embodiments. The example multiple-bit word in FIG. 3 has eight bits. Each of the eight bits is stored in a memory cell in the same row. For example, the eight bits are correspondingly stored in the memory cells in the first column to the eighth column of the same row. The indicator bit is stored in the ninth column. In the example of FIG. 3, the eight bits of the multiple-bit word augmented with the indicator bit is initially stored in the memory device in the form 101010101. That is, before the memory device is subject to flip refresh operation, the multiple-bit word stored in the memory cells from the first column to the eighth column have the bit pattern 10101010, and the indicator bit stored in the memory cell of the ninth column has a bit value of 1.

After a first flip refresh operation, the stored bit values in the memory cells from the first column to the eighth column have the bit pattern 01010101, and the stored bit value in the memory cell of the ninth column has a bit value of 0. After a second flip refresh operation, the stored bit values in the memory cells from the first column to the eighth column have the bit pattern 10101010, and the stored bit value in the memory cell of the ninth column has a bit value of 1.

After the multiple-bit word is stored in a memory device but before the stored bit values in the memory device are read back by a logic device (such as a microprocessor or other kind of logic circuit), the memory device may be subjected to various number of flip refresh operations or may be subjected to no flip refresh operation. The indicator bit stored along with the multiple-bit word allows the logic device to recover the original multiple-bit word without knowing the number of flip refresh operations that have been performed on the memory device.

For example, in the example of FIG. 3, if the stored bit value in the memory cell of the ninth column has a bit value of 1, the stored bit values in the memory cells in a column range from the first column to the eighth column (which have the bit pattern 10101010) are the bit values of the eight bits in the original multiple-bit word that has been stored in the memory device. On the other hand, if the stored bit value in the memory cell of the ninth column has a bit value of 0, the stored bit values in the memory cells from the first column to the eighth column (which have the bit pattern 01010101) are bit-wise complement values of the eight bits in the original multiple-bit word that has been stored in the memory device. When the stored bit values in the memory cells from the first column to the eighth column are read out as read-out bit values, each of the read-out bit values is inverted to obtain the original multiple-bit word that has been stored in the memory device.

In the example of FIG. 3, the eight bits of the multiple-bit word are stored in the memory cells in a column range from the first column to the eighth column, and the indicator bit is stored in the memory cell in the ninth column. In some alternative embodiments, the indicator bit is stored in the memory cell in another column different from the ninth column. For example, in some embodiments, the indicator bit is stored in the memory cell in the first column, while the eight bits of the multiple-bit word are stored in the memory cells in a column range from the second column to the ninth column. As another example, in some embodiments, the indicator bit is stored in the memory cell in the fourth column, while the first three bits of the multiple-bit word are stored in the memory cells in a column range from the first column to the third column and the other five bits of the multiple-bit word are stored in the memory cells in a column range from the fifth column to the ninth column.

In some embodiments, the stored bit values in the memory cells are read out as read-out bit values with the read-write drivers as shown in FIG. 1A while each of the read-write drivers is implemented like the read-write driver 142 in FIG. 1B. The logic device that receives the read-out bit values first determines the stored bit value in the memory cell that have the indicator bit, and then recovers the bit value of each bit in the multiple-bit word based on the stored bit value of the indicator bit. In some embodiments, if the stored bit value of the indicator bit is the bit value of 1, the bit value of each bit in the multiple-bit word is determined to be the same as the read-out bit value that is read out from the corresponding memory cell. If the stored bit value of the indicator bit is the bit value of 0, the bit value of each bit in the multiple-bit word is determined to be the bit inversion of the read-out bit value that is read out from the corresponding memory cell. In some embodiments, the bit inversion of the read-out bit value is performed by the logic device. In some alternative embodiments, the bit inversion of the read-out bit value is performed by the read-write drivers in the memory circuit 100.

FIG. 4 is a circuit diagram of a memory circuit 400 having a read-write driver that is configured to perform bit inversion on the read-out bit value based on the bit value of an indicator bit, in accordance with some embodiments. The memory circuit 400 is modified from the memory circuit 100 in FIGS. 1A-1B. In particular, each of the read-write drivers is modified to enable the bit flipping of the output signal based on the bit value of the indicator bit. For example, the read-write driver 142 is modified to include an output multiplexer 250 and an inverter 260. The output 219 of the sense amplifier 210 is connected to a first input of the output multiplexer 250. The output 219 of the sense amplifier 210 is also connected to an input of the inverter 260, and an output of the inverter 260 is connected to a second input of the output multiplexer 250. The output of the output multiplexer 250 provides the data-output terminal Dout.

The output multiplexer 250 has a selection input 255 which is configured to receive a Flip_Output control signal. If the Flip_Output control signal is at a first logic level (e.g., logic HIGH), the bit value at the data-output terminal Dout is equal to the bit value at the output 219 of the sense amplifier 210. On the other hand, if the Flip_Output control signal is at a second logic level (e.g., logic LOW), the bit value at the data-output terminal Dout is equal to the bit inversion of the bit value at the output 219 of the sense amplifier 210. In some embodiments, the Flip_Output control signal is provided by the bit value of the indicator bit that is stored in the memory circuit 400 along with the original multiple-bit word.

In some embodiments, a data in the form of a multiple-bit word is augmented with an indicator bit to form an augmented data word, and the augmented data word is stored in the same row of memory cells in the memory circuit 400. In some embodiments, the indicator bit is stored in the fourth column in the memory circuit 400. The indicator bit is stored into a memory cell in the fourth column by the read-write driver 144 as a stored bit value of the indicator bit. The stored bit value of the indicator bit is read out by the read-write driver 144 as a bit value IB_Bit_Out at the data-output terminal Dout of the read-write driver 144. In some embodiments, the selection input 255 in the read-write driver 144 is set to a logic level such that the bit value IB_Bit_Out at the data-output terminal Dout is equal to the stored bit value of the indicator bit. The bit value IB_Bit_Out is coupled to a first input of a AND gate 190. When the enabling signal IB_EN at a second input of the AND gate 190 at logic HIGH, the bit value IB_Bit_Out (i.e., the stored bit value of the indicator bit) is transmitted to the output of the AND gate 190 as the Flip_Output control signal, which is coupled to the selection input 255 of the output multiplexer 250 in the read-write driver 142 for driving the memory cells 1C12-1C42 in the second column.

In some embodiments, if the stored bit value of the indicator bit (i.e., IB_Bit_Out) at the first input of the AND gate 190 is the bit value of 1, the output bit value the data-output terminal Dout of the read-write driver 142 is equal to the redout bit value at the output 219 of the sense amplifier 210 in the read-write driver 142 in the second column. If the stored bit value of the indicator bit (i.e., IB_Bit_Out) at the first input of the AND gate 190 is the bit value of 0, the output bit value at the data-output terminal Dout of the read-write driver 142 is equal to the bit inversion of the redout bit value at the output 219 of the sense amplifier 210 in the read-write driver 142 in the second column.

When the stored bit value of the indicator bit (i.e., IB_Bit_Out) from the data-output terminal Dout of the read-write driver 144 is coupled to each of the read-write drivers (e.g., 141, 142, and 143), the output bit value at the data-output terminal Dout of each read-write driver is automatically corrected for the bit inversion. The output bit values provided by the read-write drivers are the corrected bit values for the original multiple-bit word that have been stored in the memory cells, regardless of the number of flip refresh operations that have been performed on the memory device.

In the embodiments as shown in FIGS. 1A-1B and FIG. 4, the memory cells in the memory circuits are dynamic random access memory cells (i.e., DRAM memory cells). In other embodiments, the memory cells in the memory circuits are static random access memory cells (i.e., SRAM memory cells).

Figure 5A:
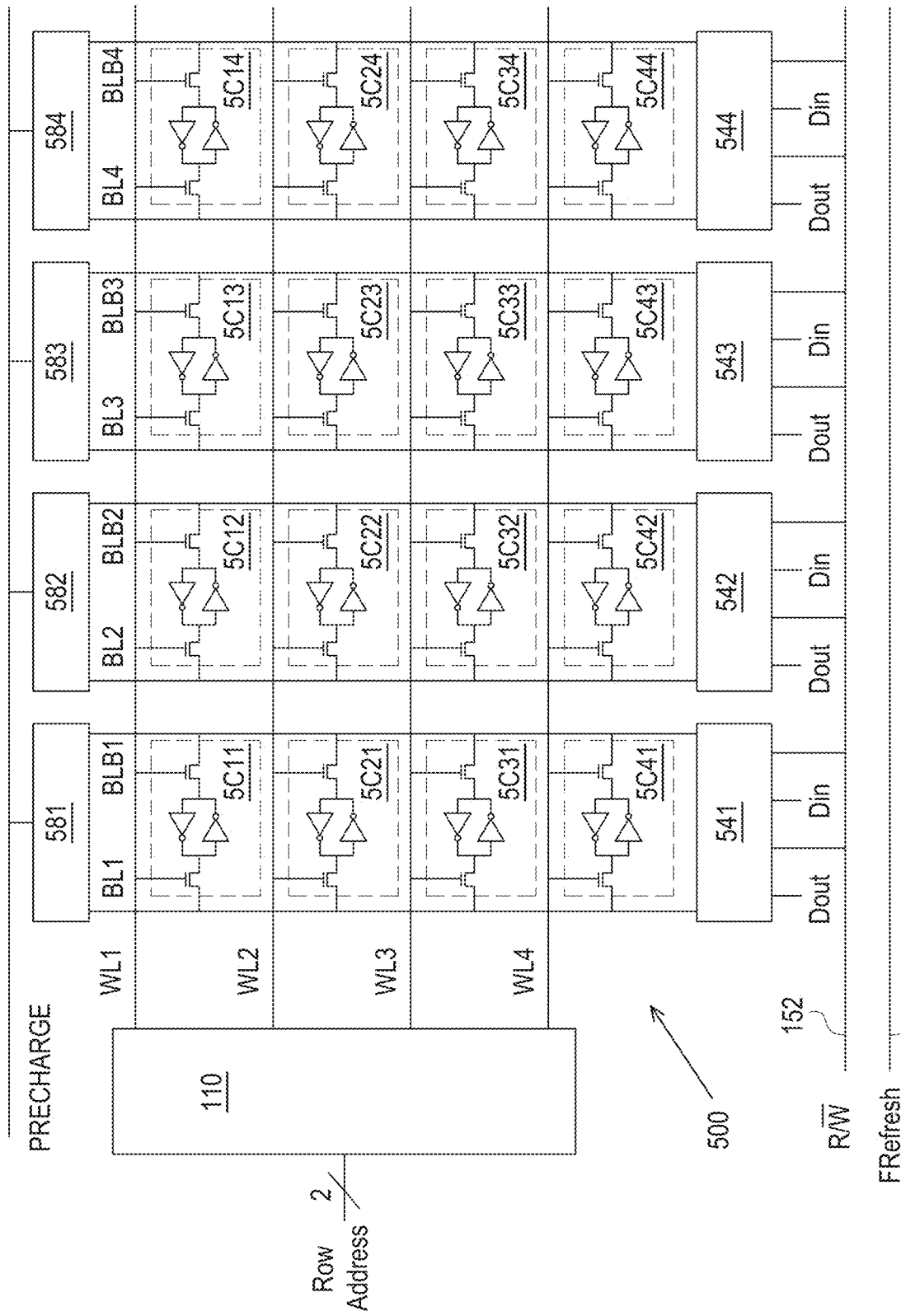
FIGS. 5A-5B are circuit diagrams of memory circuits having SRAM memory cells, in accordance with some embodiments.
Figure 5B:
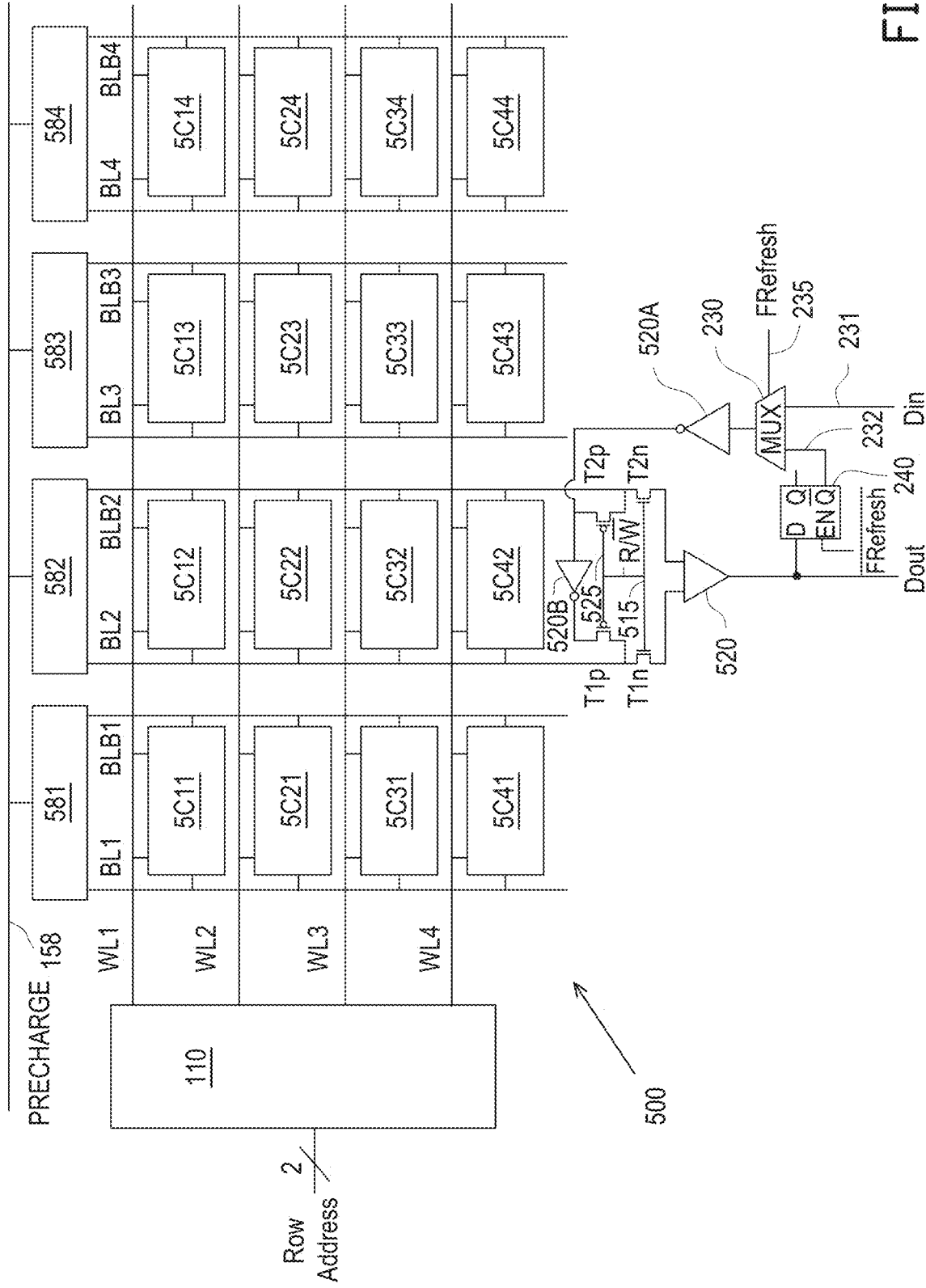
Figure 6:
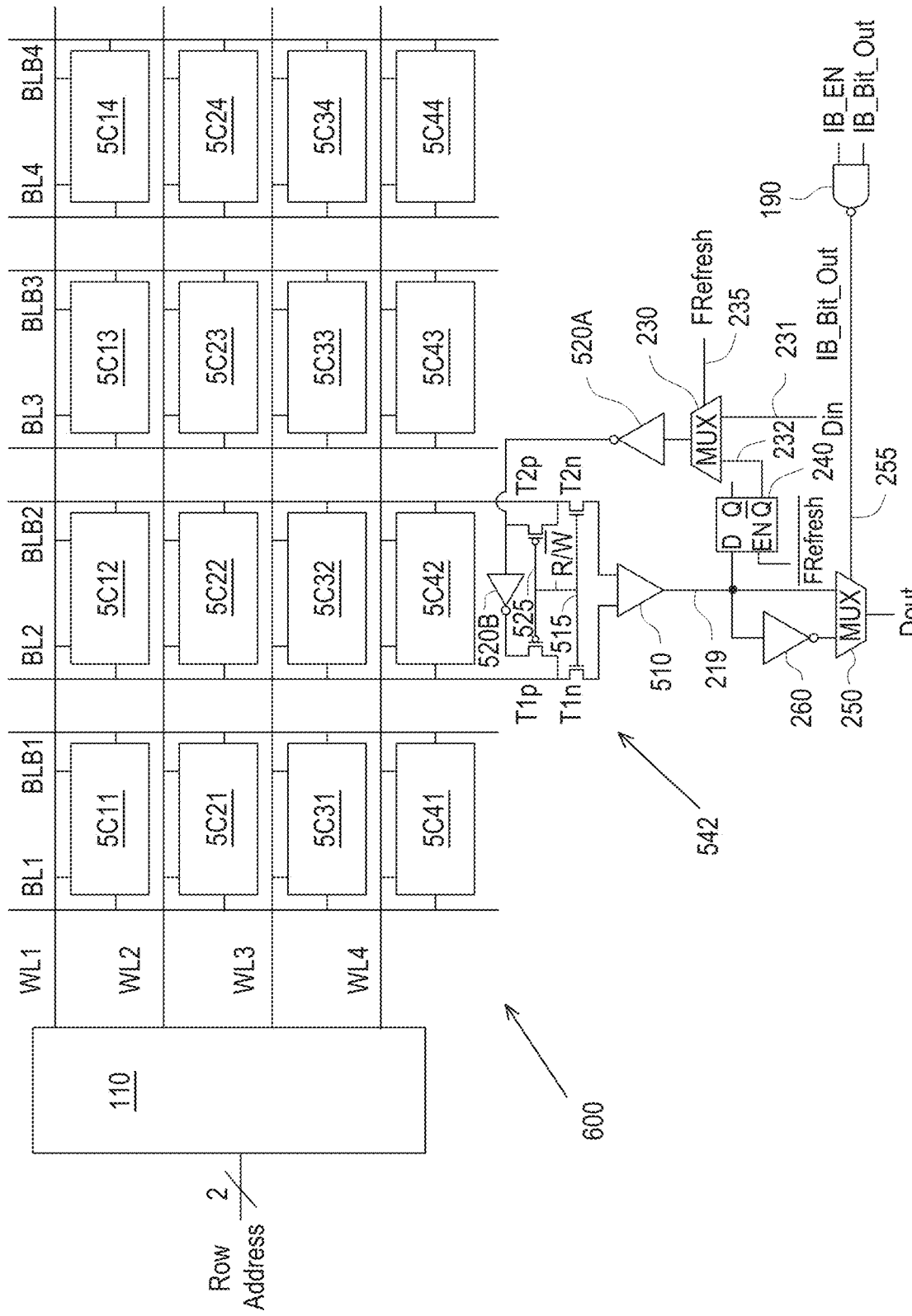
FIG. 6 is a circuit diagram of a memory circuit having SRAM memory cells and configured to perform bit inversions based on an indicator bit, in accordance with some embodiments.

FIGS. 5A-5B and FIG. 6 are circuit diagrams of memory circuits having SRAM memory cells, in accordance with some embodiments. The memory circuit 500 in FIGS. 5A-5B is modified from the memory circuit 100 in FIGS. 1A-1B. The memory circuit 600 in FIG. 6 is modified from the memory circuit 400 in FIG. 4. Each of the memory cell in the matrix of the memory cells (e.g., 1C11, 1C22, ..., and 1C44) in FIGS. 1A-1B and FIG. 4 is a DRAM memory cell, whereas each of the memory cell in the matrix of the memory cells (e.g., 5C11, 5C22, ..., and 5C44) in FIGS. 5A-5B and FIG. 6 is a SRAM memory cell.

While each column of the DRAM memory cells in FIGS. 1A-1B and FIG. 4 is connected to a data line (such as, DL1, DL2, DL3, or DL4), each column of the SRAM memory cells in FIGS. 5A-5B and FIG. 6 is associated with a set of two data lines. The set of two data lines includes a first data line identified as a bit line and a second data line identified as a bit line bar. The bit line bar carries a logical signal that is a logical complement of a logical signal on the bit line.

In FIGS. 5A-5B and FIG. 6, each of the memory cells 5C11-5C41 in the first column is connected to a bit line BL1 and a bit line bar BLB1, while the bit line BL1 and the bit line bar BLB1 are connected to a read-write driver 541 and a precharge circuit 581. Each of the memory cells 5C12-5C42 in the second column is connected to a bit line BL2 and a bit line bar BLB2, while the bit line BL2 and the bit line bar BLB2 are connected to a read-write driver 542 and a precharge circuit 582. Each of the memory cells 5C13-5C43 in the third column is connected to a bit line BL3 and a bit line bar BLB3, while the bit line BL3 and the bit line bar BLB3 are connected to a read-write driver 543 and a precharge circuit 583. Each of the memory cells 5C14-5C44 in the fourth column is connected to a bit line BL4 and a bit line bar BLB4, while the bit line BL4 and the bit line bar BLB4 are connected to a read-write driver 544 and a precharge circuit 584. The precharge circuits 581, 582, 583, and 584 are not explicitly shown in FIG. 6. Each of the precharge circuits 581, 582, 583, and 584 is configured to receive a PRECHARGE signal from a precharge control line 158.

Each of the read-write drivers 541, 542, 543, and 544 in FIGS. 5A-5B and FIG. 6 is modified from a corresponding read-write driver in FIGS. 1A-1B and FIG. 4. For example, the read-write driver 542 in FIG. 5B is modified from the read-write driver 142 in FIG. 1B, and the read-write driver 542 in FIG. 6 is modified from the read-write driver 142 in FIG. 4. In FIG. 5B, the combination of a sense amplifier 510 and two NFETs (T1$n$ and T2$n$) replace the sense amplifier 210 in FIG. 1B, while the combination of two inverters (520A and 520B) and two PFETs (T1$p$ and T2$p$) replace the write driver 220 in FIG. 1B. In FIG. 6, the combination of a sense amplifier 510 and two NFETs (T1$n$ and T2$n$) replace the sense amplifier 210 in FIG. 4, while the combination of two inverters (520A and 520B) and two PFETs (T1$p$ and T2$p$) replace the write driver 220 in FIG. 4.

In FIG. 5B and FIG. 6, the gate terminals of the two NFETs (T1$n$ and T2$n$) and the gate terminals the two PFETs (T1$p$ and T2$p$) are all connected together and configured to receive the control signal R/$\overline{\text{W}}$. When the control signal R/$\overline{\text{W}}$ is at logic LOW, the two NFETs (T1$n$ and T2$n$) are tuned off while the two PFETs (T1$p$ and T2$p$) are turned on. Consequently, the two inputs of the sense amplifier 510 in the read-write driver 542 are decoupled from the bit line BL2 and the bit line bar BLB2, while the bit line BL2 and the bit line bar BLB2 are correspondingly connected to the outputs of the two inverters 520A and 520B. That is, when the control signal R/$\overline{\text{W}}$ is at logic LOW, the two inverters 520A and 520B are enabled to write logical signals to the bit line BL2 and the bit line bar BLB2, but the sense amplifier 510 is disabled from reading the logical signals on the bit line BL2 and the bit line bar BLB2.

On the other hand, when the control signal R/$\overline{\text{W}}$ is at logic HIGH, the two NFETs (T1$n$ and T2$n$) are tuned on while the two PFETs (T1$p$ and T2$p$) are turned off. Consequently, the two inputs of the sense amplifier 510 in the read-write driver 542 are correspondingly connected to the bit line BL2 and the bit line bar BLB2, while the bit line BL2 and the bit line bar BLB2 are decoupled from the outputs of the two inverters 520A and 520B. That is, when the control signal R/$\overline{\text{W}}$ is at logic HIGH, the sense amplifier 510 is enabled to read the logical signals on the bit line BL2 and the bit line bar BLB2, but the two inverters 520A and 520B are disabled from influencing the logical signals on the bit line BL2 and the bit line bar BLB2.

The process of reading the logical signals on the bit line BL2 and the bit line bar BLB2 with the read-write driver 542 in FIG. 5B and FIG. 6 is also different from the process of reading the logical signal on the data line DL2 with the read-write driver 142 in FIG. 1B and FIG. 4. Before the logical signals on the bit line BL2 and the bit line bar BLB2 are read with the read-write driver 542, each of the bit line BL2 and the bit line bar BLB2 is charged to a corresponding reference voltage by the precharge circuit 582 which is controlled by the PRECHARGE signal received from the precharge control line 158.

In some embodiments, each of the read-write drivers are in FIG. 5A is modified from the corresponding read-write driver in FIG. 1A, in a manner similar to how the read-write driver 542 in FIG. 5B is modification from the read-write driver 142 in FIG. 1B. The operation of the memory circuit 500 in FIG. 5A is controlled with the various control signals in FIGS. 2A-2C, just like how the memory circuit 100 in FIG. 1A is controlled with the various control signals in FIGS. 2A-2C.

The read-write driver 542 in FIG. 6 is modified from the read-write driver 542 in FIG. 5B, which enables the bit flipping of the output signal at the output terminal Dout based on the bit value of an indicator bit. The modification from the read-write driver 542 in FIG. 5B to the read-write driver 542 in FIG. 6 is similar to the modification from the read-write driver 142 in FIG. 1B to the read-write driver 142 in FIG. 4. The modification includes adding an output multiplexer 250 and an inverter 260 to the read-write driver and having the selection input 255 of the output multiplexer 250 configured to receive a Flip_Output control signal. Flip_Output control signal is provided by the bit value Flip_Bit_Out of the indicator bit that is stored in the memory circuit 600.

In some embodiments, each of the read-write drivers are in FIG. 5A is modified from the corresponding read-write driver in FIG. 1A, in a manner similar to how the read-write driver 542 in FIG. 6 is modification from the read-write driver 142 in FIG. 4. The operation of the memory circuit 600 in FIG. 6 is controlled with the various control signals in FIGS. 2A-2C, just like how the memory circuit 400 in FIG. 4 is controlled with the various control signals in FIGS. 2A-2C.

Figure 7:
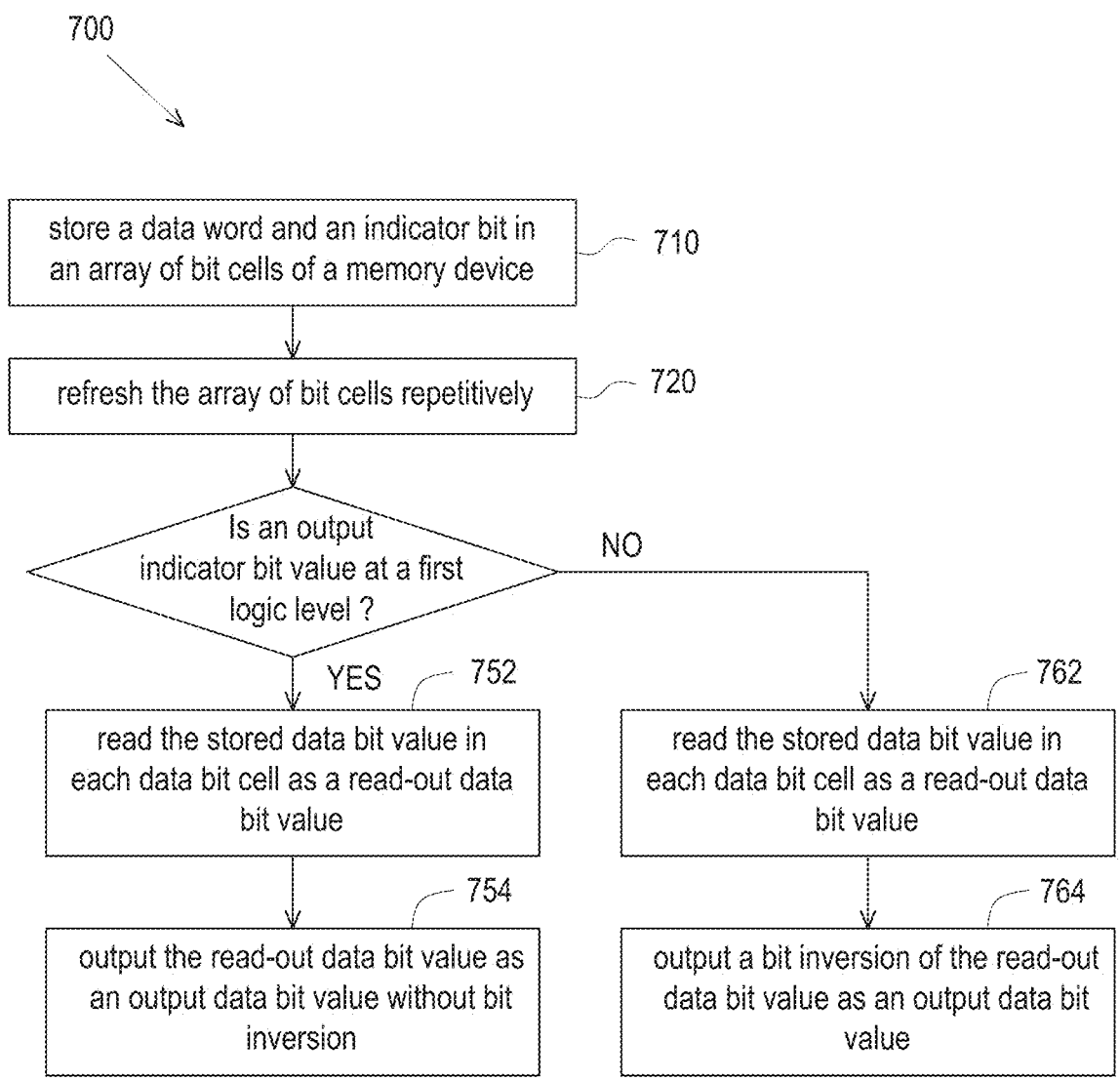
FIG. 7 is a flowchart of a method 700 of storing a data word in a memory device, in accordance with some embodiments.

FIG. 7 is a flowchart of a method 700 of a method of storing a data word in a memory device, in accordance with some embodiments. The sequence in which the operations of method 700 are depicted in FIG. 7 is for illustration only; the operations of method 700 are capable of being executed in sequences that differ from that depicted in FIG. 7. It is understood that additional operations may be performed before, during, and/or after the method 700 depicted in FIG. 7, and that some other processes may only be briefly described herein.

In operation 710 of method 700, a data word and an indicator bit are stored in an array of bit cells of a memory device. In operation 720 of method 700, the array of bit cells is refreshed repetitively. During the operation of refreshing the array of bit cells, the stored data bit value from a data bit cell is read as a read-out data bit value, and a bit inversion of the read-out data bit value is stored into the data bit cell again as a new stored data bit value. In addition, during the operation of refreshing the array of bit cells, the stored indicator bit value from the indicator bit cell is read as a read-out indicator bit value, and a bit inversion of the read-out indicator bit value is stored into the indicator bit cell again as a new stored indicator bit value.

In operation 730 of method 700, the stored indicator bit value is read from the indicator bit cell as an output indicator bit value. In operation 740 of method 700, the output indicator bit value is compared with a first logic level.

In operation 752 and operation 754 of method 700, the stored data bit value in each selected data bit cell is read as a read-out data bit value, and the read-out data bit value is output as an output data bit value without bit inversion.

In operation 762 and operation 764 of method 700, the stored data bit value in each selected data bit cell is read as a read-out data bit value, and the bit inversion of the read-out data bit value is output as an output data bit value.

Figure 8:
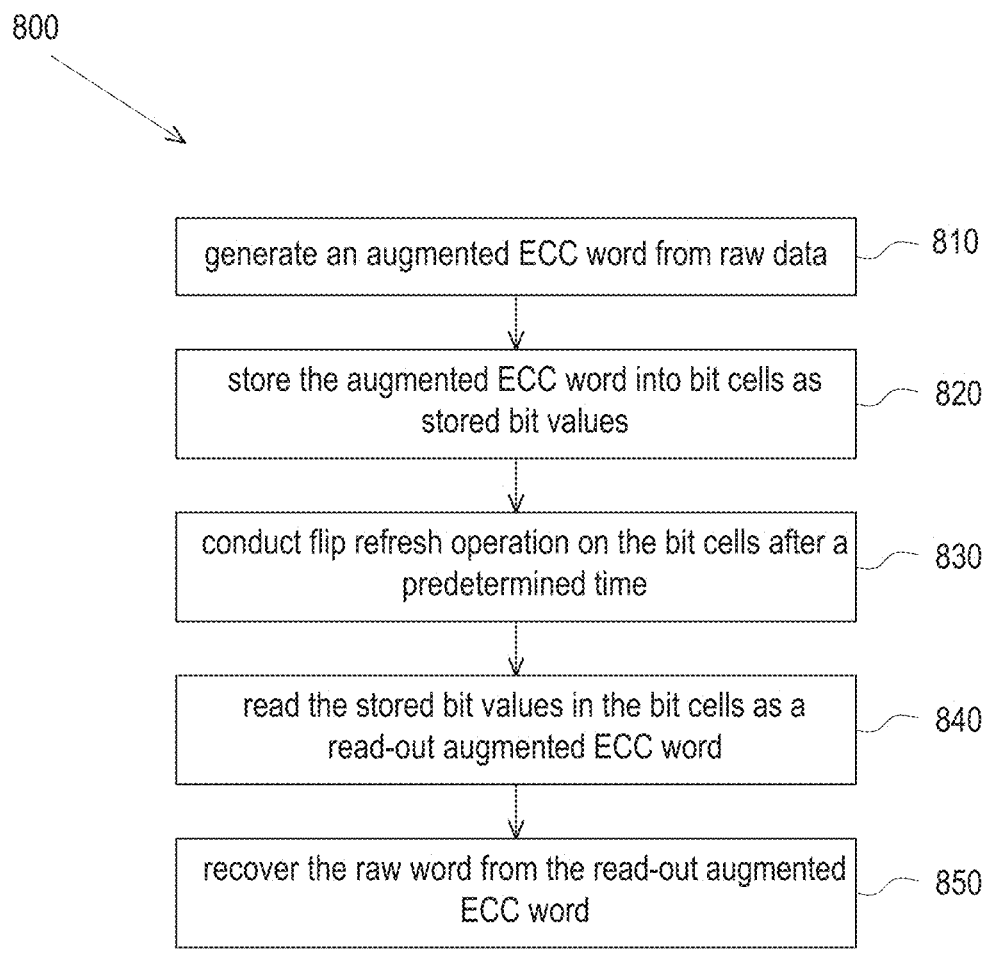
FIG. 8 is a flowchart of a method of storing data involving an error correction code ("ECC") algorithm, in accordance with some embodiments.

FIG. 8 is a flowchart of a method 800 of a method of storing data involving an error correction code ("ECC") algorithm, in accordance with some embodiments. The sequence in which the operations of method 800 are depicted in FIG. 8 is for illustration only; the operations of method 800 are capable of being executed in sequences that differ from that depicted in FIG. 8. It is understood that additional operations may be performed before, during, and/or after the method 800 depicted in FIG. 8, and that some other processes may only be briefly described herein.

In operation 810 of method 800, an augmented ECC word is generated from raw data. In operation 820 of method 800, the augmented ECC word is stored into bit cells as stored bit values. In operation 830 of method 800, flip refresh operation is carried out on the bit cells after a predetermined time. In operation 840 of method 800, the stored bit values in the bit cells are read out as a read-out augmented ECC word. In operation 850 of method 800, the raw word is recovered from the read-out augmented ECC word.

Figure 9A:
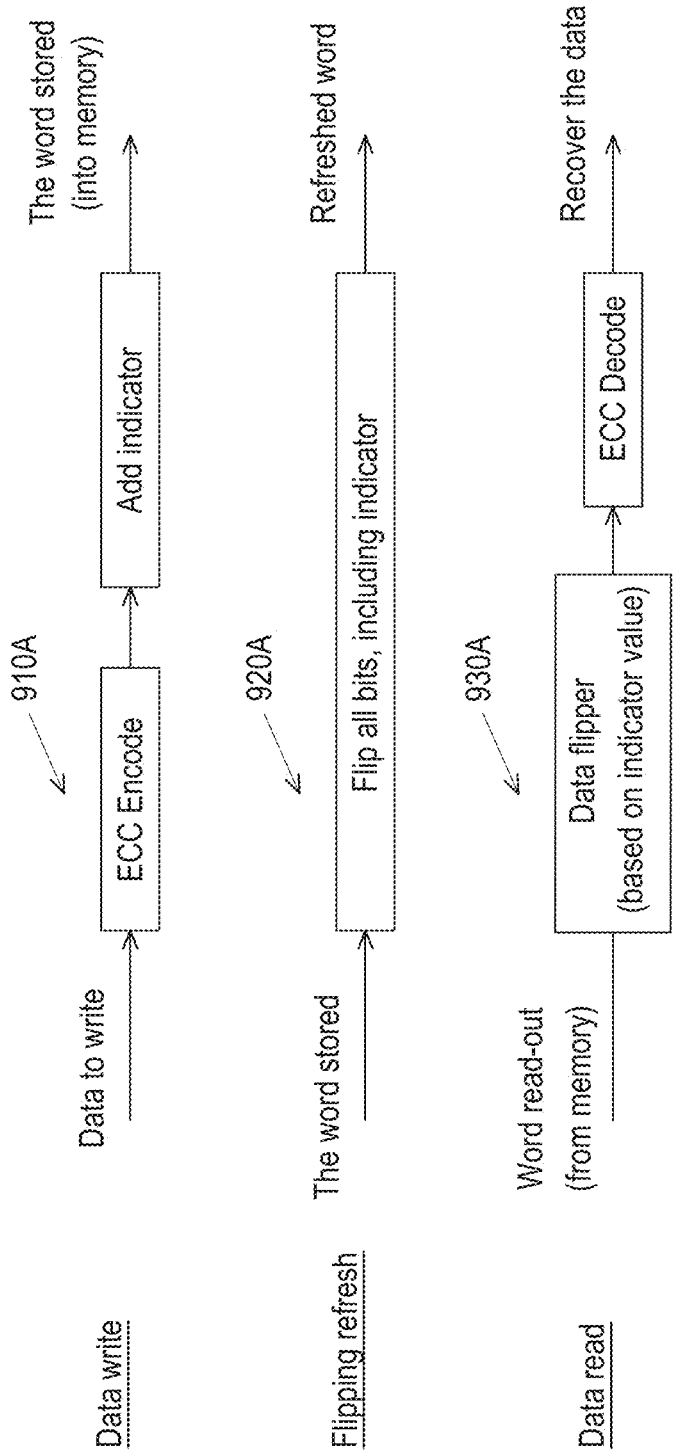
FIGS. 9A-9B are schematic drawings of selected processes during the operations of the method in FIG. 8, in accordance with some embodiments.
Figure 9B:
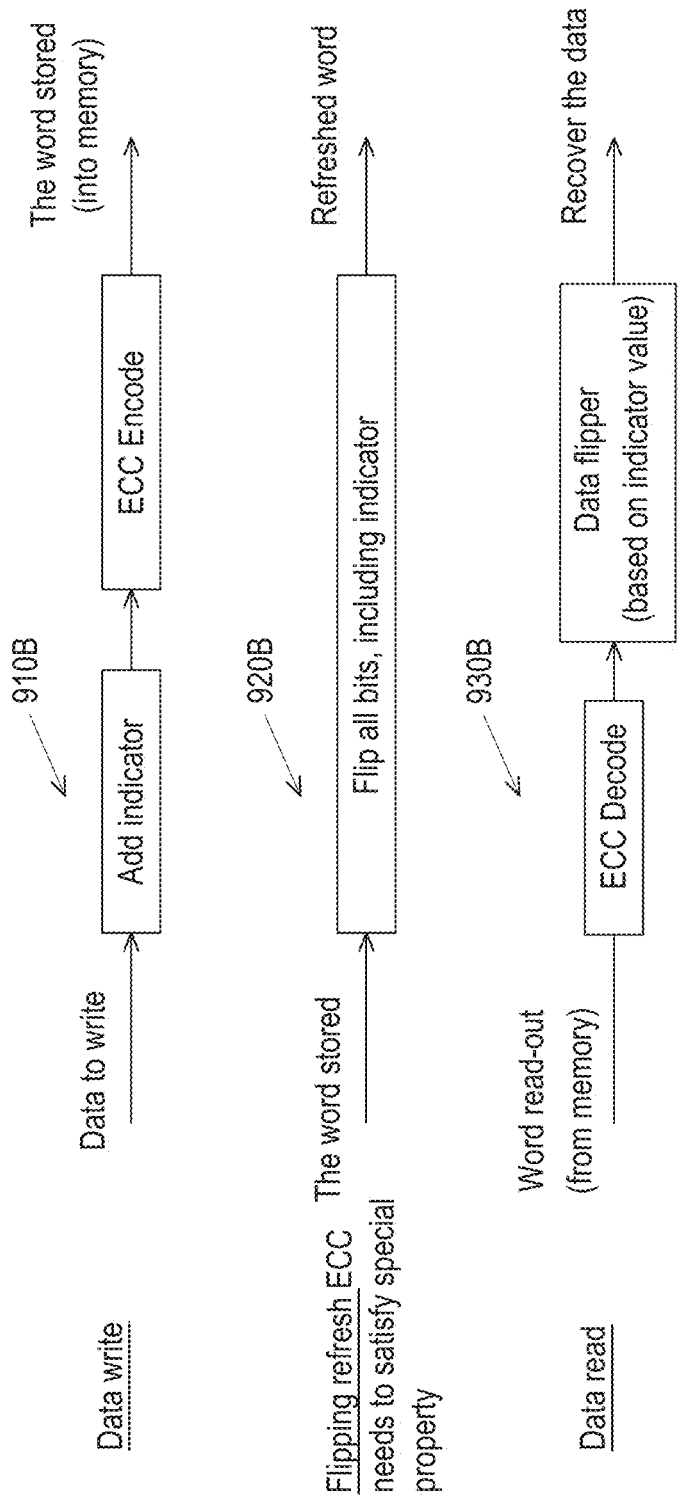

FIGS. 9A-9B are schematic drawings of selected processes during the operations of the method 800 in FIG. 8, in accordance with some embodiments. In a first example as shown in FIG. 9A, the selected processes during the operations of the method 800 include processes 910A, 920A, and 930A. During the process 910A of carrying out the operations 810 and 820 of method 800, after an ECC encoded data is generated by encoding the raw data with an ECC algorithm, an indicator bit is combined with the ECC encoded data to form an augmented ECC word, and then, the augmented ECC word is stored into bit cells of a memory circuit as stored bit values. Examples of the memory circuit used to store the augmented ECC word include the memory circuit 100 in FIGS. 1A-1B, the memory circuit 400 in FIG. 4, the memory circuit 500 in FIGS. 5A-5B, the memory circuit 600 in FIG. 6. The ECC encoded data generally is a multiple-bit word. An example method of combining a multiple-bit word with an indicator bit is shown in FIG. 3. While the indicator bit in FIG. 3 is the last bit of an augmented multiple-bit word, implementing the indicator bit at other position (i.e., not just the last bit) of the augmented multiple-bit word is within the contemplated scope of the present disclosure.

During the process 920A of carrying out the operation 830 of method 800, the stored bit values in the bit cells of the memory circuit are flipped with flip refresh operations. In some embodiments, the stored bit values in the bit cells are repetitively subject to the flip refresh operations. In some embodiments, the stored bit values in the bit cells are periodically subject to the flip refresh operations. Example timing diagrams of various control signals applied to the memory circuit during the flip refresh operations is shown in FIG. 2C.

During the process 930A of carrying out the operations 840 and 850 of method 800, the stored bit values in the bit cells of the memory circuit are read out as a read-out augmented ECC word, then, the corrected augmented ECC word is obtained based on the indicator bit (e.g., with the assistance of a data flipper process or circuit). If the indicator bit indicates that the read-out augmented ECC word needs to be flipped, then, the corrected augmented ECC word is the bit-wise inversion of the read-out augmented ECC word. If the indicator bit indicates that the read-out augmented ECC word does not need to be flipped, then, the corrected augmented ECC word is the same as the read-out augmented ECC word. After stripping off the indicator bit in the corrected augmented ECC word, the ECC encoded data is obtained. Thereafter, the raw data is recovered by decoding the ECC encoded data with the ECC algorithm.

In a second example as shown in FIG. 9B, the selected processes during the operations of the method 800 include processes 910B, 920B, and 930B. During the process 910B of carrying out the operations 810 and 820 of method 800, after an indicator bit is combined with a raw data to form an augmented raw data word, an augmented ECC word is generated by encoding the augmented raw data word with an ECC algorithm. Then, the augmented ECC word is stored into bit cells of a memory circuit as stored bit values. Examples of the memory circuit used to store the augmented ECC word include the memory circuit 100 in FIGS. 1A-1B, the memory circuit 400 in FIG. 4, the memory circuit 500 in FIGS. 5A-5B, the memory circuit 600 in FIG. 6. The raw data word generally is a multiple-bit word. An example method of combining a multiple-bit word with an indicator bit is shown in FIG. 3. Other methods of combining a multiple-bit word with an indicator bit is within the contemplated scope of the present disclosure.

During the process 920B of carrying out the operation 830 of method 800, the stored bit values in the bit cells of the memory circuit are flipped with flip refresh operations. In some embodiments, the stored bit values in the bit cells are repetitively subject to the flip refresh operations. In some embodiments, the stored bit values in the bit cells are periodically subject to the flip refresh operations. Example timing diagrams of various control signals applied to the memory circuit during the flip refresh operations is shown in FIG. 2C. In some embodiments, the number of times that the stored bit values in the bit cells are subject to the flip refresh operations is counted.

During the process 930B of carrying out the operations 840 and 850 of method 800, the stored bit values in the bit cells of the memory circuit are read out as a read-out augmented ECC word. Then, the read-out augmented ECC word is decoded with the ECC algorithm, thereby a read-out augmented raw data word is obtained. After stripping off the indicator bit in the read-out augmented raw data word, the raw data is recovered.

An aspect of the present disclosure relates to an integrated circuit. The integrated circuit includes an array of word lines, and a first array of memory cells configured to receive selection signals from the array of word lines. Each memory cell is configured to become a selected memory cell based on the selection signals. The integrated circuit also includes a first set of data lines associated with the first array of memory cells. Each memory cell in the first array of memory cells is connected to one or more data lines in the first set of data lines. The integrated circuit further includes a first read-write driver connected to the first set of data lines and configured to receive a flip-refresh control signal. The first read-write driver has a catch circuit configured to store a first bit value related to a stored bit value in the selected memory cell. The first read-write driver is configured to store a second bit value into the selected memory cell through the first set of data lines based on the first bit value. The second bit value is a bit inversion of the stored bit value.

Another aspect of the present disclosure relates to a method. The method includes storing a data word and an indicator bit in an array of bit cells of a memory device. The operation of storing the data word and the indicator bit includes storing each bit value in the data word into a data bit cell as a stored data bit value and storing an indicator bit value of the indicator bit into an indicator bit cell as a stored indicator bit value. The method also includes refreshing the array of bit cells repetitively. The operation of refreshing the array of bit cells includes reading the stored data bit value from a data bit cell as a read-out data bit value, reading the stored indicator bit value from the indicator bit cell as a read-out indicator bit value, storing a bit inversion of the read-out data bit value into the data bit cell as the stored data bit value, and storing a bit inversion of the read-out indicator bit value into the indicator bit cell as the stored indicator bit value.

Still another aspect of the present disclosure relates to a method of storing data. The method includes generating an augmented error correction code (ECC) word from raw data based on an ECC algorithm, storing the augmented ECC word into bit cells as stored bit values, and refreshing the bit cells after a predetermined time by modifying the stored bit value in each of the bit cells. The operation of modifying the stored bit value in a bit cell includes reading the stored bit value in the bit cell as a first bit value, and storing a second bit value into the bit cell as the stored bit value, with the second bit value being a bit inversion of the first bit value.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit comprising:
   an array of word lines;
   a first array of memory cells configured to receive selection signals from the array of word lines, wherein each memory cell is configured to become a selected memory cell based on the selection signals;
   a first set of data lines associated with the first array of memory cells, wherein each memory cell in the first array of memory cells is connected to one or more data lines in the first set of data lines; and
   a first read-write driver connected to the first set of data lines and configured to receive a flip-refresh control signal, wherein the first read-write driver has a catch circuit configured to store a first bit value related to a stored bit value in the selected memory cell, and wherein the first read-write driver is configured to store a second bit value into the selected memory cell through the first set of data lines based on the first bit value, with the second bit value being a bit inversion of the stored bit value.

2. The integrated circuit of claim 1, wherein the first array of memory cells includes an array of dynamic random access memory cells, and a first set of data lines includes at least one data line.

3. The integrated circuit of claim 1, wherein the first array of memory cells includes an array of static random access memory cells.

4. The integrated circuit of claim 1, further comprising:
a sense amplifier configured to read the stored bit value in the selected memory cell through the first set of data lines, wherein an output of the sense amplifier is connected to the catch circuit.

5. The integrated circuit of claim 1, further comprising:
a write multiplexer having a first input configured to receive an input bit value and a second input connected to the catch circuit; and
a write driver having an input connected to an output of the write multiplexer, wherein the write driver is configured to store the second bit value into the selected memory cell through the first set of data lines.

6. The integrated circuit of claim 5, wherein the first read-write driver has a data-input terminal configured to receive the input bit value and a flip-refresh control terminal configured to receive a flip-refresh control signal, and wherein the write multiplexer is configured to be controlled by the flip-refresh control signal.

7. The integrated circuit of claim 1, wherein the first read-write driver has a data-input terminal, a data-output terminal, and a flip-refresh control terminal.

8. The integrated circuit of claim 1, further comprising:
a sense amplifier configured to read the stored bit value in the selected memory cell through the first set of data lines;
an inverter having an input connected to an output of the sense amplifier; and
an output multiplexer having a first input connected to the output of the sense amplifier and having a second input connected to an output of the inverter.

9. The integrated circuit of claim 8, further comprising:
a second array of memory cells configured to receive the selection signals from the array of word lines;
a second set of data lines associated with the second array of memory cells, wherein each memory cell in the second array of memory cells is connected to one or more data lines in the second set of data lines;
a second read-write driver connected to the second set of data lines and configured to receive the flip-refresh control signal, wherein the second read-write driver is configured to read a stored bit value of an indicator bit stored in one of the memory cells in the second array of memory cells; and
wherein the first read-write driver is configured to have the output multiplexer configured to receive the stored bit value of the indicator bit from the second read-write driver.

10. The integrated circuit of claim 1, further comprising:
a second array of memory cells configured to receive the selection signals from the array of word lines;
a second set of data lines associated with the second array of memory cells, wherein each memory cell in the second array of memory cells is connected to one or more data lines in the second set of data lines; and
a second read-write driver connected to the second set of data lines and configured to receive the flip-refresh control signal.

11. The integrated circuit of claim 10, further comprising:
a third array of memory cells configured to receive the selection signals from the array of word lines;
a third set of data lines associated with the third array of memory cells, wherein each memory cell in the third array of memory cells is connected to one or more data lines in the third set of data lines; and
a third read-write driver connected to the third set of data lines and configured to receive the flip-refresh control signal.

12. A method comprising:
storing a data word and an indicator bit in an array of bit cells of a memory device, wherein storing the data word and the indicator bit comprises storing each bit value in the data word into a data bit cell as a stored data bit value and storing an indicator bit value of the indicator bit into an indicator bit cell as a stored indicator bit value; and
refreshing the array of bit cells repetitively, wherein refreshing the array of bit cells comprises:
reading the stored data bit value from a data bit cell as a read-out data bit value,
reading the stored indicator bit value from the indicator bit cell as a read-out indicator bit value,
storing a bit inversion of the read-out data bit value into the data bit cell as the stored data bit value, and
storing a bit inversion of the read-out indicator bit value into the indicator bit cell as the stored indicator bit value.

13. The method of claim 12, further comprising:
reading the stored indicator bit value from the indicator bit cell as an output indicator bit value; and
for each selected data bit cell in the array of bit cells, reading the stored data bit value from the selected data bit cell as a read-out data bit value and inverting the read-out data bit value based on the output indicator bit value.

14. A method of storing data comprising:
generating an augmented error correction code (ECC) word from raw data based on an ECC algorithm;
storing the augmented ECC word into bit cells as stored bit values; and
refreshing the bit cells after a predetermined time by modifying the stored bit value in each of the bit cells, wherein modifying the stored bit value in a bit cell comprises,
reading the stored bit value in the bit cell as a first bit value, and
storing a second bit value into the bit cell as the stored bit value, with the second bit value being a bit inversion of the first bit value.

15. The method of claim 14, further comprising:
generating an ECC encoded data by encoding the raw data with the ECC algorithm, and wherein generating the augmented ECC word comprises combining an indicator bit with the ECC encoded data.

16. The method of claim 15, further comprising:
reading the stored bit values in the bit cells as a read-out augmented ECC word after refreshing the bit cells by at least one time;
obtaining the ECC encoded data from the read-out augmented ECC word based on a bit value of the indicator bit; and
obtaining the raw data by decoding the ECC encoded data.

17. The method of claim 14, further comprising:
generating an augmented raw data word by combining an indicator bit with the raw data, and wherein generating the augmented ECC word comprises encoding the augmented raw data word with the ECC algorithm.

18. The method of claim 17, further comprising:
reading the stored bit values in the bit cells as a read-out augmented ECC word after refreshing the bit cells by at least one time;

obtaining the augmented raw data word by decoding the read-out augmented ECC word; and obtaining the raw data based on a bit value of the indicator bit in the augmented raw data word.

19. The method of claim 14, wherein refreshing the bit cells comprising:

refreshing the bit cells periodically.

20. The method of claim 14, wherein refreshing the bit cells comprising:

refreshing the bit cells repetitively.

* * * * *